United States Patent [19]
Ruque

[11] Patent Number: 5,989,037
[45] Date of Patent: Nov. 23, 1999

[54] METHOD OF RENOVATING A CABINET FOR ELECTRONIC CARD DRAWERS AND A CABINET RENOVATED THEREBY

[75] Inventor: Christian Ruque, Corbas, France

[73] Assignee: Gec Alsthom Transport SA, Paris, France

[21] Appl. No.: 08/962,821

[22] Filed: Nov. 3, 1997

[30] Foreign Application Priority Data

Nov. 4, 1996 [FR] France .................................. 96 13396

[51] Int. Cl.[6] .................................................. H01R 9/09
[52] U.S. Cl. ........................................................... 439/61
[58] Field of Search ................................ 439/59, 61, 62, 439/325, 247, 248, 296, 377; 361/725, 727, 608, 609; 312/333; 324/323

[56] References Cited

U.S. PATENT DOCUMENTS 5,620,329 4/1997 Kidd et al. ................................ 439/248

FOREIGN PATENT DOCUMENTS

0452575 A1 10/1991 European Pat. Off. ......... H05K 7/14
87 115 62 U 11/1988 Germany ......................... H05K 5/00

*Primary Examiner*—Paula Bradley
*Assistant Examiner*—Alexander Gilman
*Attorney, Agent, or Firm*—Sughrue, Mion, Zinn, Macpeak & Seas, PLLC

[57] ABSTRACT

The present invention relates to a method of renovating a cabinet for electronic card drawers, the method comprising steps consisting in:

creating an unpluggable electronic drawer having connectors on its back face;

mounting an adapter intermediate mechanical support in the cabinet to be renovated, which support supports a set of floating backplane connectors for the unpluggable electronic drawer;

creating a free zone Z between said back supports for the backplane connectors of the cabinet, and said intermediate supports; and fitting adapter wiring between said back supports and said intermediate supports.

7 Claims, 2 Drawing Sheets

5,989,037

METHOD OF RENOVATING A CABINET FOR ELECTRONIC CARD DRAWERS AND A CABINET RENOVATED THEREBY

FIELD OF THE INVENTION

The present invention relates generally to cabinets for electronic card drawers, and more particularly to a method of renovating such cabinets and to a cabinet renovated thereby for electronic card drawers.

The method of the invention for renovating a cabinet for electronic card drawers is described more particularly as applied to the rail transport field.

The cabinet for electronic card drawers as renovated by the method of renovating of the invention is thus more particularly intended to constitute an on-board cabinet in a rail vehicle.

BACKGROUND OF THE INVENTION

Because electronic components are changing fast, and because purchasing an entire new item of equipment represents a considerable investment, more and more equipment operators are renovating existing equipment.

This applies in particular since, generally, the mechanical portions and the power electronics not only age well but also represent the largest proportion of the cost of the overall equipment.

Conversely, the control electronics are often obsolete after only a few years.

The consequences of the above are that components can no longer be found on the market, or they can be found only at prices that are prohibitive for repair purposes, and that maintenance costs are high, compared with the possible new solutions.

Beyond a certain cost, renovation of the control electronics is envisaged.

Several prior art solutions for performing such renovation are described below.

Prior art cabinets for electronic card drawers and prior art equipment to be renovated are constructed to old standards, such as the DIN 297 standard, the CF 61002 standard, and the XNF 61005 standard.

New standards must be complied with, such as the EN 50 155 standard, or the CLC/TCYX (sec) 95 standard appended to EN 50 155.

A first prior art solution consists in upgrading the prior art drawers such that they remain identical to the old drawers so that the cabinet retains identical interfaces.

A major drawback with the first prior art solution is that the drawer is not adapted to suit new techniques and new standards, in particular as regards reductions in volume, the bus technique, and new connector solutions.

A second prior art solution consists in reconstructing new cabinets by integrating drawers having the most recent technologies and taking into account new standards.

A major drawback with the second prior art solution is that it involves large costs as regards designing the integration of the cabinet because it is necessary to adapt the construction of the cabinet and because all the wiring needs to be revised, e.g. the wiring of the vehicle when applied to the transport field, by adapting the old wiring by means of additional intermediate connection points.

Another drawback with the second prior art solution is that it takes a long time to perform the renovation, in particular to design the adaptation and to implement it, because the old cabinets must be removed, the wiring must be modified in situ, and the new cabinet must be fitted.

Another drawback with the second prior art solution is that it gives rise to risks of malfunction: the second solution involves reworking wiring that is already old by adding intermediate wiring.

Another drawback with the second prior art solution is that, once completed, the renovation is irreversible.

The prior art equipment to be renovated mounted on board a vehicle, in particular a rail vehicle, is disposed in a fitted cabinet in which electronics drawers are mounted disposed one above another.

At the back, a cabinet backplane provides the support for floating connectors which, with appropriate wiring, implement the functional links between the drawers and the wiring of the vehicle. Drawers are slotted in via the front of the cabinet.

At the back of the drawer, connectors plug into the cabinet connectors.

OBJECTS AND SUMMARY OF THE INVENTION

Therefore, an object of the invention is to provide a method of renovating a cabinet for electronic card drawers making it possible to obtain a cabinet that does not suffer from the drawbacks of prior art renovated cabinets.

According to the invention, the method of renovating a cabinet for electronic card drawers comprises steps consisting in:

creating an unpluggable electronic drawer having connectors on its back face and whose depth P is less than the depth L of the drawer to be renovated;

mounting an adapter intermediate mechanical support in the cabinet to be renovated, which support supports a set of floating backplane connectors for the unpluggable electronic drawer;

retaining the following from said cabinet to be renovated: a mechanical cabinet assembly; back supports for the backplane connectors for the drawers to be renovated; all of said backplane connectors for the drawers to be renovated; and the outlet wiring of the cabinet;

creating a free zone Z between said back supports for the backplane connectors of the cabinet, and said intermediate supports as equipped with said floating backplane connectors for the unpluggable electronic drawers; and fitting adapter wiring and/or adapter backplane drawers between said back supports and said intermediate supports so as to connect said floating backplane connectors for the unpluggable electronic drawers to said backplane connectors of the cabinet.

The method of the invention for renovating a cabinet for electronic card drawers also satisfies either one of the following characteristics:

said wiring is connected to said backplane connectors of the cabinet by means of link connectors; and said intermediate supports are implemented such that they can be passed through the front of the cabinet to be renovated and fixed thereto.

According to another characteristic of the invention, the cabinet for electronic card drawers includes a mechanical cabinet assembly including back supports for backplane connectors for the drawers to be renovated, a set of backplane connectors for the drawers to be renovated, and outlet wiring of the cabinet, wherein:

said cabinet is suitable for receiving at least one unpluggable electronic drawer having connectors on its back face and whose depth P is less than the depth L of said drawer to be renovated;

an intermediate mechanical support supports a set of floating backplane connectors for the unpluggable electronic drawers;

a free zone z is created between said back supports for the backplane connectors of the cabinet and said intermediate supports equipped with said floating backplane connectors for the unpluggable electronic drawers; and adapter wiring and/or adapter backplane drawers are fitted between said back supports and said intermediate supports.

The cabinet of the invention for electronic card drawers also satisfies either one of the following characteristics:

said wiring is connected to said backplane connectors of the cabinet by means of link connectors; and said cabinet has been renovated by implementing the method of renovating of the invention.

An advantage of the method of the invention for renovating a cabinet for electronic card drawers is that the structure of the existing cabinet is not reworked.

Another advantage of the method of the invention for renovating a cabinet for electronic card drawers is that the wiring of the vehicle is not reworked.

Another advantage of the method of the invention for renovating a cabinet for electronic card drawers is that the overall cost of renovation is reduced both at design level and at implementation level.

Another advantage of the method of the invention for renovating a cabinet for electronic card drawers is that the time for which the vehicle needs to be taken out of service is limited.

Another advantage of the method of the invention for renovating a cabinet for electronic card drawers is that the renovation is made reversible if such reversal should become necessary.

Another advantage of the method of the invention for renovating a cabinet for electronic card drawers is that technical risks are reduced.

BRIEF DESCRIPTION OF THE DRAWINGS

Other objects, characteristics, and advantages of the invention appear on reading the following description of the preferred method of renovating a cabinet for electronic card drawers, as well as of a cabinet renovated thereby, given with reference to the accompanying drawings, in which.

MORE DETAILED DESCRIPTION

Figure 1:
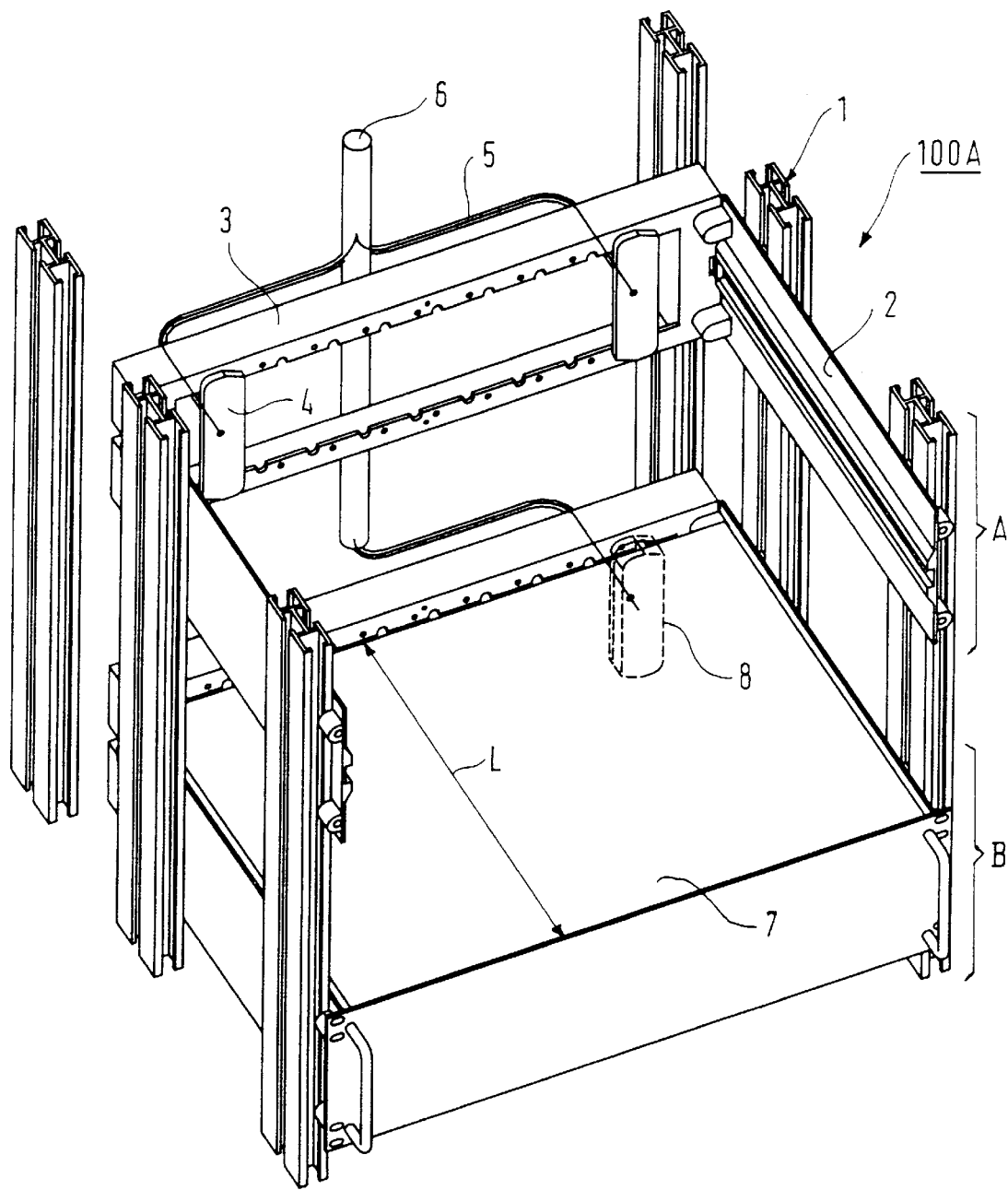
FIG. 1 is a perspective view from the front of a cabinet shown prior to renovation and containing a prior art electronic card drawer.

The method of the invention for renovating a cabinet for electronic card drawers comprises steps in which:

an unpluggable electronic drawer 13 is created having connectors 14 on its back face and whose depth P is less than the depth L of the drawer to be renovated 7;

an adapter intermediate mechanical support 9 supporting all of the floating connectors 10 for said unpluggable electronic drawer 13 is fitted in the cabinet to be renovated 100A;

a mechanical cabinet assembly is retained from said cabinet to be renovated 100A, the assembly being constituted, for example, by uprights 1, side plates 2, back supports 3 for the backplane connectors 4 for the drawers to be renovated, all of said backplane connectors 4 for the drawers to be renovated, and the outlet wiring 5 of the cabinet 100A;

a free zone Z is created between said back supports 3 for supporting the backplane connectors 4 of the cabinet 100A, and said intermediate supports 9 as equipped with backplane connectors 10 for the unpluggable electronic drawers 13; and adapter wiring 11 or adapter intermediate drawers (not shown) are fitted between said back supports 3 and said intermediate supports 9.

Preferably, the new intermediate support is implemented such that it can be passed through the front of the cabinet to be renovated and fixed simply thereto.

It is preferable for the entire intermediate drawer to be prepared outside the vehicle so that, once inside the vehicle, it is merely necessary to plug in the back connectors and to fix the new intermediate support(s) as equipped with the wired connectors.

The method of the invention for renovating a cabinet for electronic card drawers makes it possible to implement one or more new drawers that are optimum in terms, in particular, of the functions that they contain, of height, of width, of cable outlet, and of connector type.

The method of the invention for renovating a cabinet for electronic card drawers makes it possible to reduce design costs considerably.

This is because only the intermediate drawer together with the intermediate support need to be designed, assuming that the new drawer has been developed separately.

The method of the invention for renovating a cabinet for electronic card drawers makes it possible to reduce considerably the renovation costs at parts level.

The cabinet and the cabinet outlet wiring are retained.

In addition, the new drawers used are standardized and built to new standards and therefore optimized.

Finally the intermediate drawer can be made outside the vehicle.

The method of the invention for renovating a cabinet for electronic card drawers makes it possible to reduce considerably the time required for working on the vehicle, and thus to reduce the time for which the vehicle is out of service.

The method of the invention for renovating a cabinet for electronic card drawers makes it possible to reduce considerably the risks of breakdown inherent in reworking old wiring.

The method of the invention for renovating a cabinet for electronic card drawers is reversible, and it is thus easy to return to the pre-renovation situation.

This advantage is important given the risks inherent to reworking existing wiring.

Reworking existing wiring involves cutting old cables whose insulation is weakened.

In addition, with shielded cables, fitting connectors requires the shielding to be interrupted, thereby adversely affecting the initial electrical characteristics.

Furthermore, renovation generally takes place over long periods, and the method of renovating of the invention makes it easy to manage the renovation by reducing the number of wiring dossiers between the renovated state and the non-renovated state.

FIG. 1 is a perspective view from the front of a cabinet 100A shown prior to renovation and containing a prior art electronic card drawer 7.

FIG. 1 shows a mechanical cabinet assembly constituted by uprights 1, side plates 2, and back supports 3 for the backplane connectors 4 for the drawers.

The backplane connectors 4 are mounted to be floating and they follow on from the cabinet wiring 5.

The cabinet wiring 5 is implemented by various links leading either to the backplane connectors 4 or to cabinet connectors 6.

The cabinet wiring 5 is situated behind the connector supports 3.

To enable the description of the cabinet prior to renovation to be better understood, FIG. 1 shows two drawer states in the same cabinet.

In zone A, the cabinet is shown without the electronic card drawer to be renovated 7 being mounted in it.

In zone B, the electronic card drawer to be renovated 7 is shown in the cabinet in the inserted position.

The electronic card drawer to be renovated 7 is rectangular block shaped, and it has a drawer connector 8 which plugs into the backplane connector 4, thereby implementing the functional link necessary for correct operation.

The drawer 7 has depth characteristics L such that it takes up all of the space available in front of the connector support 3.

Figure 2:
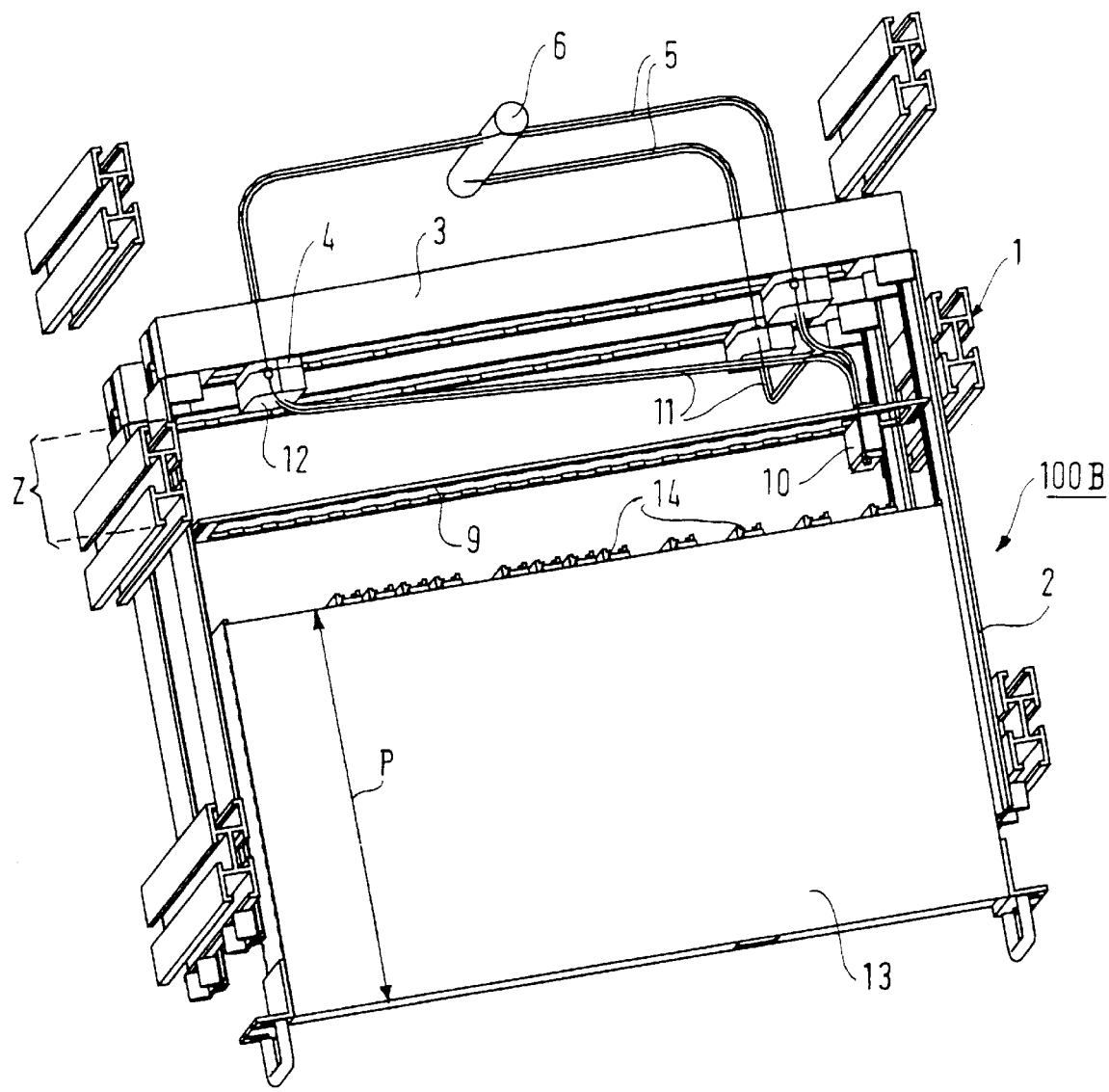
FIG. 2 is a perspective view from above of a cabinet shown after renovation and containing an electronic card drawer of the invention.

FIG. 2 is a perspective view from above of a cabinet 100B shown after renovation and containing an electronic card drawer of the invention.

FIG. 2 shows the same mechanical cabinet assembly as in FIG. 1.

By way of example, the mechanical cabinet assembly is thus also constituted by uprights 1, side plates 2, and back supports 3 for backplane connectors 4.

The backplane connectors 4 also follow on from the cabinet wiring 5.

The old drawer 7 has been removed from the cabinet to be renovated 100A shown in FIG. 1, and an intermediate connector support 9 supporting floating backplane connectors 10 has been disposed in front of the back connector supports 3.

Wiring links 11 lead off from the floating connectors 10 and their other ends are connected to link connectors 12.

The link connectors 12 are fixed to and connected to the backplane connectors 4 so that functional continuity is provided for the links between the cabinet connector 6 and the unpluggable electronic drawer 13 equipped with suitable back connectors 14.

The unpluggable electronic drawer 13 making it possible to implement the method of renovating of the invention has a small depth P so that, once it is plugged in, it fits in place of the old drawer 7.

Once the unpluggable electronic drawer 13 is fully plugged in, the front face of the drawer is next to the end face of the side plate 2.

When the drawer is in such a position, the connectors 10 and 14 are electrically interconnected.

I claim:

1. A cabinet for electronic card drawers, said cabinet including a mechanical cabinet assembly including back supports for supporting backplane connectors for drawers to be renovated, a set of backplane connectors for the drawers to be renovated mounted on said back supports and oriented so that an insertion direction of said backplane connectors for the drawers to be renovated is parallel to an insertion direction of the drawers to be renovated, and outlet wiring of the cabinet, wherein:

said cabinet is suitable for receiving at least one unpluggable electronic drawer having connectors on its back face, and wherein a depth P of the at least one unpluggable electronic drawer is less than a depth L of the drawers to be renovated;

an intermediate mechanical support supports a set of floating backplane connectors for the unpluggable electronic drawers;

a free zone Z is created between said back supports for the backplane connectors of the cabinet and said intermediate supports equipped with said floating backplane connectors for the unpluggable electronic drawers; and at least one of adapter wiring and adapter intermediate drawers are fitted between said back supports and said intermediate supports.

2. A cabinet according to claim 1, in which said adapter wiring is connected to said backplane connectors for the drawers to be renovated by link connectors.

3. A cabinet for an unpluggable electronic card drawer made in accordance with the following process:

providing a mechanical cabinet assembly to be renovated, comprising:
   a back support for mounting a first backplane connector,
   a first backplane connector mounted to said back support and oriented so that an insertion direction of said first backplane connector is parallel to an insertion direction of the unpluggable electronic card drawer, and
   outlet wiring;

mounting an adapter intermediate mechanical support in the cabinet forward of said back support to create a free zone Z between said back support and said intermediate support, said intermediate support supporting a second backplane connector; and fitting at least one of adapter wiring and an adapter intermediate drawer in said free zone to form an electrical connection between said first backplane connector and said second backplane connector.

4. A cabinet assembly for an unpluggable electronic card drawer, comprising:

an opening for insertion of the unpluggable electronic connector;

a side plate for guiding movement along an insertion direction of the electronic card drawer within said cabinet assembly;

a back support for supporting a backplane connector for a drawer to be renovated;

a first backplane connector for the drawer to be renovated mounted on said back support and oriented so that an insertion direction of said first backplane connector for the drawer to be renovated is parallel to the insertion direction of the electronic card drawer;

an intermediate mechanical support supporting a second backplane connector for mating with a corresponding electrical connector on a back face of the unpluggable electronic, said intermediate mechanical support spaced apart from said back support in the insertion direction of the unpluggable electronic drawer, thereby forming a free zone Z between said back support and said intermediate support; and at least one of an adapter wiring and an adapter intermediate drawer disposed in said free zone for connecting said first backplane connector to said second backplane connector.

5. The cabinet according to claim 4, wherein said second backplane connector is a floating backplane connector.

6. The cabinet according to claim 4 wherein said adapter wiring is connected to said first backplane connectors by link connectors.

7. The cabinet according to claim 4, further comprising an outlet wire for connecting said first connector to an outside device.

* * * * *